(12) United States Patent
Kuo et al.

(10) Patent No.: US 12,245,521 B2
(45) Date of Patent: Mar. 4, 2025

(54) MAGNETIC MEMORY AND MANUFACTURING METHOD THEREOF

(71) Applicant: United Microelectronics Corp., Hsinchu (TW)

(72) Inventors: Chih-Wei Kuo, Tainan (TW); Chung Yi Chiu, Tainan (TW); Yi-Wei Tseng, New Taipei (TW); Hsuan-Hsu Chen, Tainan (TW); Chun-Lung Chen, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 378 days.

(21) Appl. No.: 17/885,521

(22) Filed: Aug. 10, 2022

(65) Prior Publication Data

US 2024/0016067 A1 Jan. 11, 2024

(30) Foreign Application Priority Data

Jul. 8, 2022 (TW) .................................. 111125798

(51) Int. Cl.
*H10N 52/80* (2023.01)
*H10B 61/00* (2023.01)
*H10N 52/00* (2023.01)
*H10N 52/01* (2023.01)

(52) U.S. Cl.
CPC ............. *H10N 52/80* (2023.02); *H10B 61/00* (2023.02); *H10N 52/00* (2023.02); *H10N 52/01* (2023.02)

(58) Field of Classification Search
CPC ........ H10N 52/80; H10N 52/01; H10N 52/00; H10N 50/20; H10N 50/00; H10B 61/00; H10B 62/20
See application file for complete search history.

(56) References Cited

U.S. PATENT DOCUMENTS

| | | | |
|---|---|---|---|
| 8,796,795 B2 | 8/2014 | Satoh et al. | |
| 2020/0144498 A1* | 5/2020 | Yang | H10N 50/10 |
| 2021/0159390 A1* | 5/2021 | Reznicek | H10N 50/80 |
| 2021/0257543 A1* | 8/2021 | Wu | H10N 50/85 |
| 2023/0389439 A1* | 11/2023 | Huang | H10N 50/85 |

* cited by examiner

*Primary Examiner* — Latanya N Crawford Eason
(74) *Attorney, Agent, or Firm* — JCIPRNET

(57) ABSTRACT

A magnetic memory including a substrate, a spin-orbit torque (SOT) layer, a magnetic tunnel junction (MTJ) stack, a first protection layer, and a second protection layer is provided. The SOT layer is located over the substrate. The MTJ stack is located on the SOT layer. The first protection layer and the second protection layer are located on the sidewall of the MTJ stack. The first protection layer is located between the second protection layer and the MTJ stack. There is a notch between the second protection layer and the SOT layer.

20 Claims, 12 Drawing Sheets

MAGNETIC MEMORY AND MANUFACTURING METHOD THEREOF

CROSS-REFERENCE TO RELATED APPLICATION

This application claims the priority benefit of Taiwan application serial no. 111125798, filed on Jul. 8, 2022. The entirety of the above-mentioned patent application is hereby incorporated by reference herein and made a part of this specification.

BACKGROUND

Technical Field

The invention relates to a memory and a manufacturing method thereof, and particularly relates to a magnetic memory and a manufacturing method thereof.

Description of Related Art

At present, the spin-orbit torque magnetic random access memory (SOT-MRAM) includes a spin-orbit torque (SOT) layer and a magnetic tunnel junction (MTJ) stack located on the SOT layer. In addition, a protection layer is formed on the sidewall of the MTJ stack to prevent moisture from causing damage to the MTJ stack. For example, a protection material layer is formed on the MTJ stack, and then a dry etching process is performed on the protection material layer to form the protection layer on the sidewall of the MTJ stack. However, the dry etching process used to form the protection layer will cause damage to the SOT layer.

SUMMARY

The invention provides a magnetic memory and a manufacturing method thereof, which can prevent the SOT layer from being damaged in the dry etching process.

The invention provides a magnetic memory, which includes a substrate, a SOT layer, an MTJ stack, a first protection layer, and a second protection layer. The SOT layer is located over the substrate. The MTJ stack is located on the SOT layer. The first protection layer and the second protection layer are located on the sidewall of the MTJ stack. The first protection layer is located between the second protection layer and the MTJ stack. There is a notch between the second protection layer and the SOT layer.

According to an embodiment of the invention, in the magnetic memory, the notch may be further located between the first protection layer and the SOT layer.

According to an embodiment of the invention, in the magnetic memory, the cross-sectional shape of the first protection layer may be a linear shape.

According to an embodiment of the invention, in the magnetic memory, the cross-sectional shape of the first protection layer may be an L-shape.

According to an embodiment of the invention, the magnetic memory may further include an oxide layer. The oxide layer is located between the first protection layer and the SOT layer.

According to an embodiment of the invention, in the magnetic memory, the first protection layer may have a protrusion portion. The top of the protrusion portion may be higher than the top surface of the MTJ stack.

According to an embodiment of the invention, in the magnetic memory, the second protection layer may have a protrusion portion. The top of the protrusion portion may be higher than the top surface of the MTJ stack.

According to an embodiment of the invention, in the magnetic memory, the MTJ stack may include a free layer, a pinned layer, and a tunnel barrier layer. The free layer is located on the SOT layer. The pinned layer is located on the free layer. The tunnel barrier layer is located between the pinned layer and the free layer.

According to an embodiment of the invention, the magnetic memory may further include a first interconnect structure and a second interconnect structure. The first interconnect structure is electrically connected to the SOT layer. The second interconnect structure is electrically connected to the SOT layer.

According to an embodiment of the invention, in the magnetic memory, the first interconnect structure may be located below the SOT layer and may be located on one side of the MTJ stack, and the second interconnect structure may be located below the SOT layer and may be located on another side of the MTJ stack.

The invention provides a manufacturing method of a magnetic memory, which includes the following steps. A substrate is provided. A SOT layer is formed over the substrate. An MTJ stack is formed on the SOT layer. A first protection layer and a second protection layer are formed on the sidewall of the MTJ stack. The first protection layer is located between the second protection layer and the MTJ stack. There is a notch between the second protection layer and the SOT layer.

According to an embodiment of the invention, in the manufacturing method of the magnetic memory, the method of forming the first protection layer and the second protection layer may include the following steps. A first protection material layer is conformally formed on the MTJ stack and the SOT layer. A second protection material layer is conformally formed on the first protection material layer. A dry etching process is performed on the second protection material layer to form the second protection layer. A wet etching process is performed on the first protection material layer to form the first protection layer and the notch and to expose a portion of the SOT layer and the top surface of the MTJ stack.

According to an embodiment of the invention, in the manufacturing method of the magnetic memory, the MTJ stack may include a free layer, a pinned layer, and a tunnel barrier layer. The free layer is located on the SOT layer. The pinned layer is located on the free layer. The tunnel barrier layer is located between the pinned layer and the free layer.

According to an embodiment of the invention, in the manufacturing method of the magnetic memory, the method of forming the MTJ stack may include the following steps. A free material layer, a tunnel barrier material layer, and a pinned material layer are sequentially formed on the SOT layer. The pinned material layer, the tunnel barrier material layer, and the free material layer are patterned to form the pinned layer, the tunnel barrier layer, and the free layer and to expose a portion of the SOT layer.

According to an embodiment of the invention, in the manufacturing method of the magnetic memory, the method of forming the MTJ stack, the first protection layer, and the second protection layer may include the following steps. A free material layer, a tunnel barrier material layer, and a pinned material layer are sequentially formed on the SOT layer. The pinned material layer, the tunnel barrier material layer, and the free material layer are patterned to form the pinned layer, the tunnel barrier layer, and the free layer. The free layer may include a main portion and a side portion. The main portion is located below the tunnel barrier layer. The side portion is located aside the main portion and is connected to the main portion. The thickness of the main portion may be greater than the thickness of the side portion. A first protection material layer is conformally formed on the pinned layer, the tunnel barrier layer, the free layer, and the SOT layer. In the step of forming the first protection material layer, the side portion may be oxidized to an oxide layer. A second protection material layer is conformally formed on the first protection material layer. A dry etching process is performed on the second protection material layer to form the second protection layer. A wet etching process is performed on the first protection material layer and the oxide layer to form the first protection layer and the notch and to expose a portion of the SOT layer and the top surface of the pinned layer.

According to an embodiment of the invention, in the manufacturing method of the magnetic memory, the oxide layer may be completely removed in the wet etching process.

According to an embodiment of the invention, in the manufacturing method of the magnetic memory, a portion of the oxide layer may be removed in the wet etching process, and the remaining oxide layer may be located between the first protection layer and the SOT layer.

According to an embodiment of the invention, the manufacturing method of the magnetic memory may further include the following step. A first interconnect structure and a second interconnect structure are formed. The first interconnect structure and the second interconnect structure may be electrically connected to the SOT layer.

According to an embodiment of the invention, in the manufacturing method of the magnetic memory, the notch may be further located between the first protection layer and the SOT layer.

According to an embodiment of the invention, in the manufacturing method of the magnetic memory, the second protection layer may have a protrusion portion. The top of the protrusion portion may be higher than the top surface of the MTJ stack.

Based on the above description, in the magnetic memory and the manufacturing method thereof according to the invention, the first protection layer and the second protection layer are located on the sidewall of the MTJ stack, the first protection layer is located between the second protection layer and the MTJ stack, and there is a notch between the second protection layer and the SOT layer. Therefore, in the dry etching process for forming the second protection layer, the SOT layer can be prevented from being damaged.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1E are cross-sectional views illustrating a manufacturing process of a magnetic memory according to some embodiments of the invention. FIG. 2 is a cross-sectional view illustrating a magnetic memory according to other embodiments of the invention.

Figure 1A:
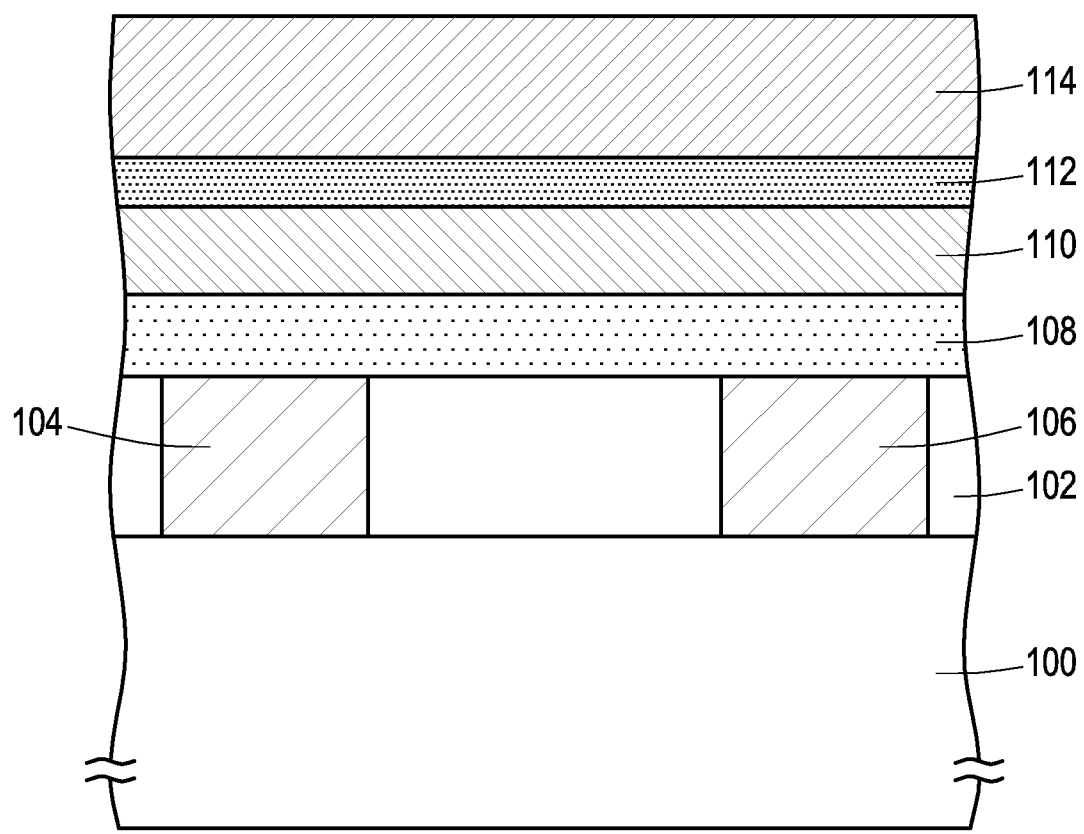
FIG. 1A to FIG. 1E are cross-sectional views illustrating a manufacturing process of a magnetic memory according to some embodiments of the invention.
Figure 2:
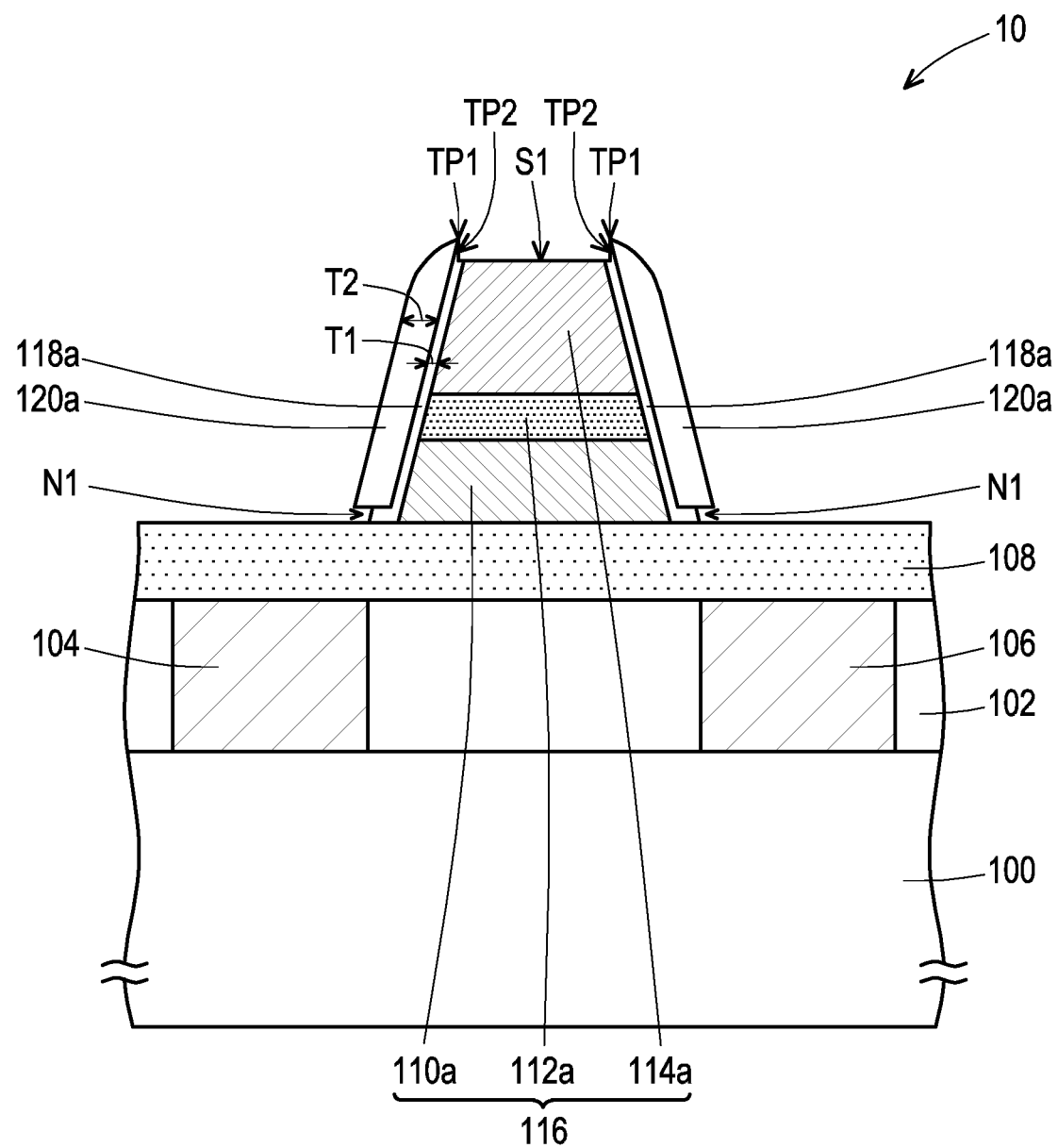
FIG. 2 is a cross-sectional view illustrating a magnetic memory according to other embodiments of the invention.

Referring to FIG. 1A, a substrate 100 is provided. The substrate 100 may be a semiconductor substrate such as a silicon substrate. In addition, although not shown in the figures, the substrate 100 may have required components thereon, such as semiconductor devices (e.g., active devices and/or passive devices), dielectric layers and/or interconnect structures, and the description thereof is omitted here.

A dielectric layer 102 may be formed on the substrate 100. The dielectric layer 102 may be a single-layer structure or a multilayer structure. The material of the dielectric layer 102 is, for example, silicon oxide, silicon nitride, or a combination thereof. The method of forming the dielectric layer 102 is, for example, a chemical vapor deposition (CVD) method.

Furthermore, an interconnect structure 104 and an interconnect structure 106 may be formed. The interconnect structure 104 and the interconnect structure 106 may be separated from each other. The interconnect structure 104 and the interconnect structure 106 may be formed in the dielectric layer 102. In some embodiments, the interconnect structure 104 and the interconnect structure 106 may be vias, but the invention is not limited thereto. In some embodiments, the interconnect structure 104 and the interconnect structure 106 may be electrically connected to other interconnect structures (not shown) on substrate 100. The materials of the interconnect structure 104 and the interconnect structure 106 are, for example, metal such as tungsten. In some embodiments, the interconnect structure 104 and the interconnect structure 106 may be formed by a damascene process.

A SOT layer 108 is formed over the substrate 100. The interconnect structure 104 and the interconnect structure 106 may be electrically connected to the SOT layer 108. In some embodiments, the interconnect structure 104 and the interconnect structure 106 may be in direct contact with the SOT layer 108. The material of the SOT layer 108 is, for example, tantalum (Ta), tantalum nitride (TaN), platinum (Pt), tungsten (W), or tungsten nitride (WN). In some embodiments, the SOT layer 108 may be formed by a deposition process (e.g., a physical vapor deposition (PVD) process), a lithography process, and an etching process.

A free material layer 110, a tunnel barrier material layer 112, and a pinned material layer 114 may be sequentially formed on the SOT layer 108. The material of the free material layer 110 is, for example, iron (Fe), cobalt (Co), or nickel (Ni). The method of forming the free material layer 110 is, for example, a PVD method. The material of the tunnel barrier material layer 112 is, for example, magnesium oxide (MgO). The method of forming the tunnel barrier material layer 112 is, for example, a PVD method. The material of the pinned material layer 114 is, for example, iron, cobalt, or nickel. The method of forming the pinned material layer 114 is, for example, a PVD method.

Figure 1B:
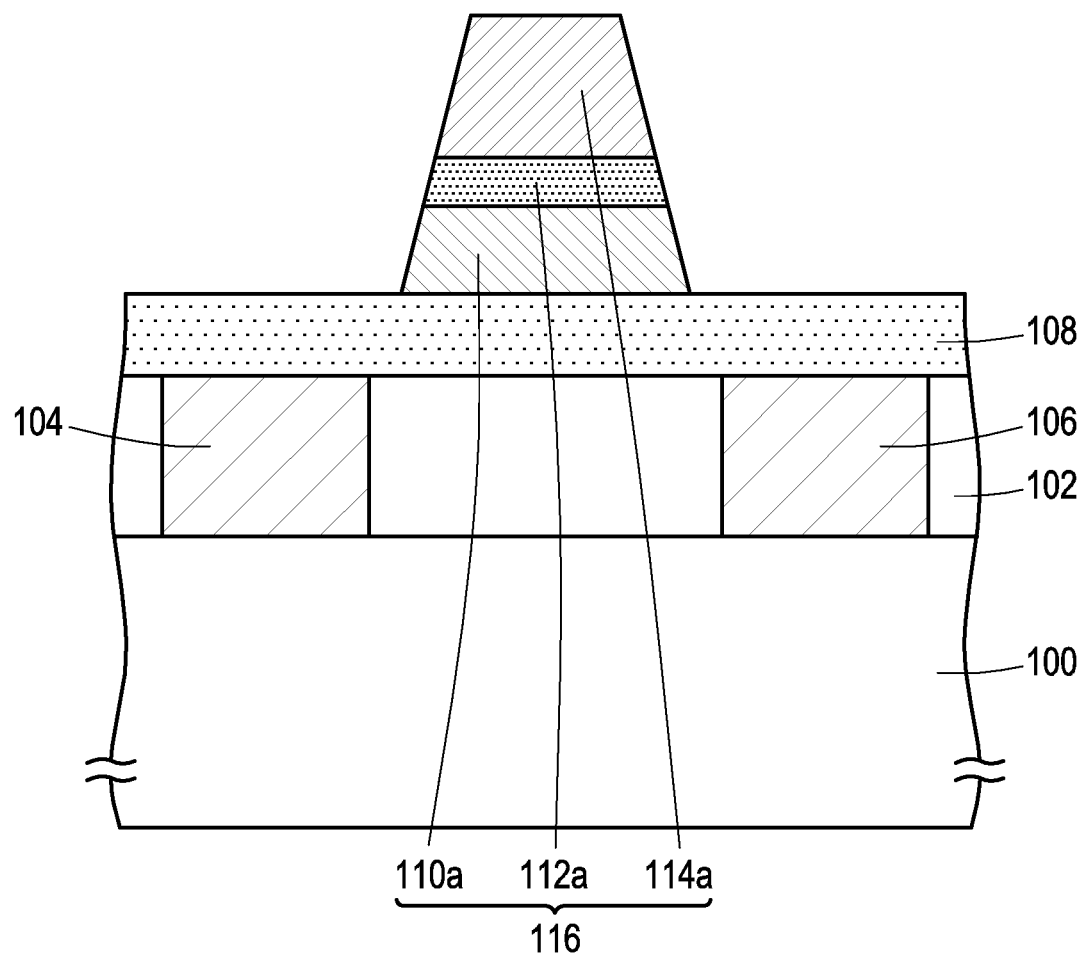

Referring to FIG. 1B, the pinned material layer 114, the tunnel barrier material layer 112, and the free material layer 110 may be patterned to form a pinned layer 114a, a tunnel barrier layer 112a, and a free layer 110a and to expose a portion of the SOT layer 108. Therefore, a MTJ stack 116 may be formed on the SOT layer 108. The MTJ stack 116 may include the free layer 110a, the pinned layer 114a, and the tunnel barrier layer 112a. The free layer 110a is located on the SOT layer 108. The material of the free layer 110a is, for example, iron, cobalt, or nickel. The pinned layer 114a is located on the free layer 110a. The material of the pinned layer 114a is, for example, iron, cobalt, or nickel. The tunnel barrier layer 112a is located between the pinned layer 114a and the free layer 110a. The material of the tunnel barrier layer 112a is, for example, magnesium oxide. In some embodiments, the pinned material layer 114, the tunnel barrier material layer 112, and the free material layer 110 may be patterned by a lithography process and an etching process (e.g., a dry etching process).

Figure 1C:
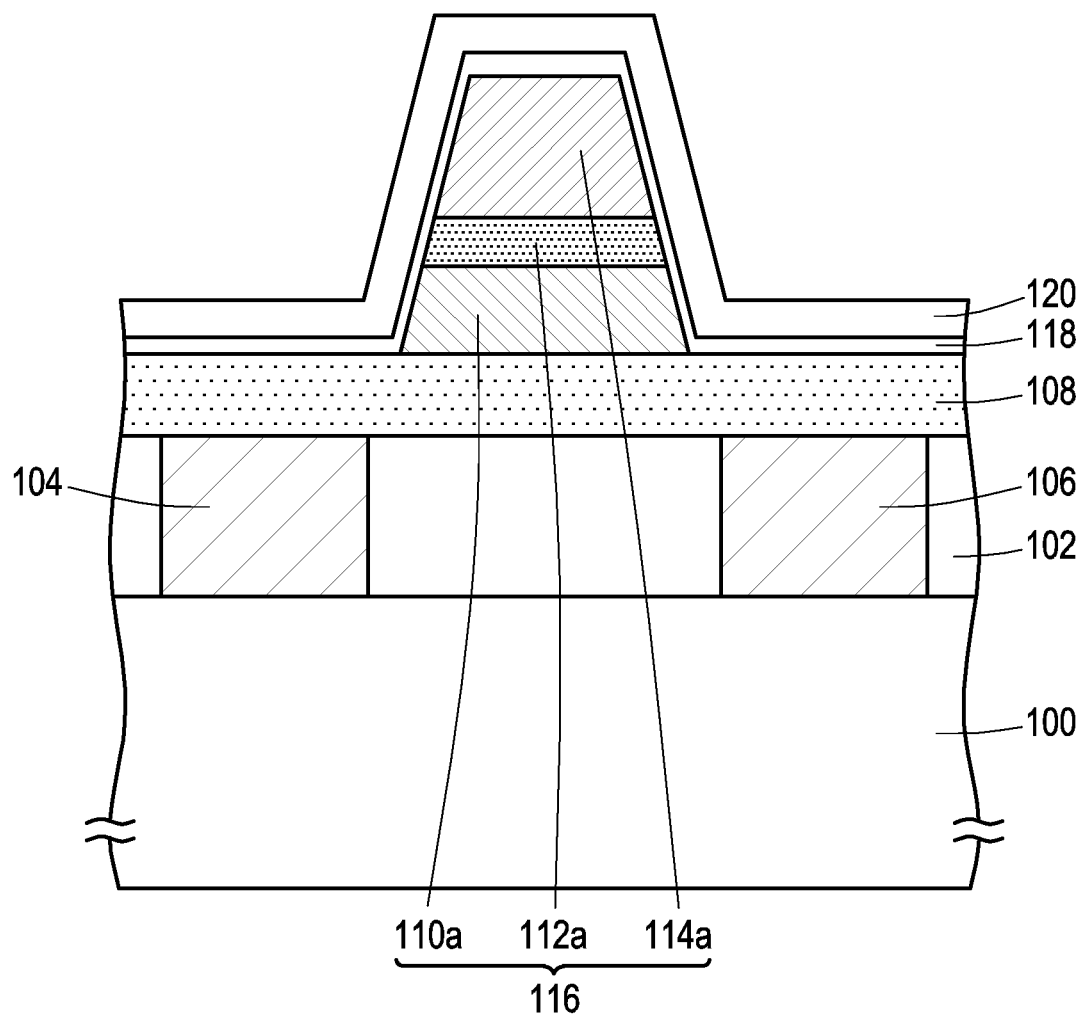

Referring to FIG. 1C, a protection material layer 118 may be conformally formed on the MTJ stack 116 and the SOT layer 108. The material of the protection material layer 118 is, for example, silicon oxide. The method of forming the protection material layer 118 is, for example, an atomic layer deposition (ALD) method.

A protection material layer 120 may be conformally formed on the protection material layer 118. The material of the protection material layer 120 is, for example, silicon nitride. The method of forming the protection material layer 120 is, for example, an ALD method.

Figure 1D:
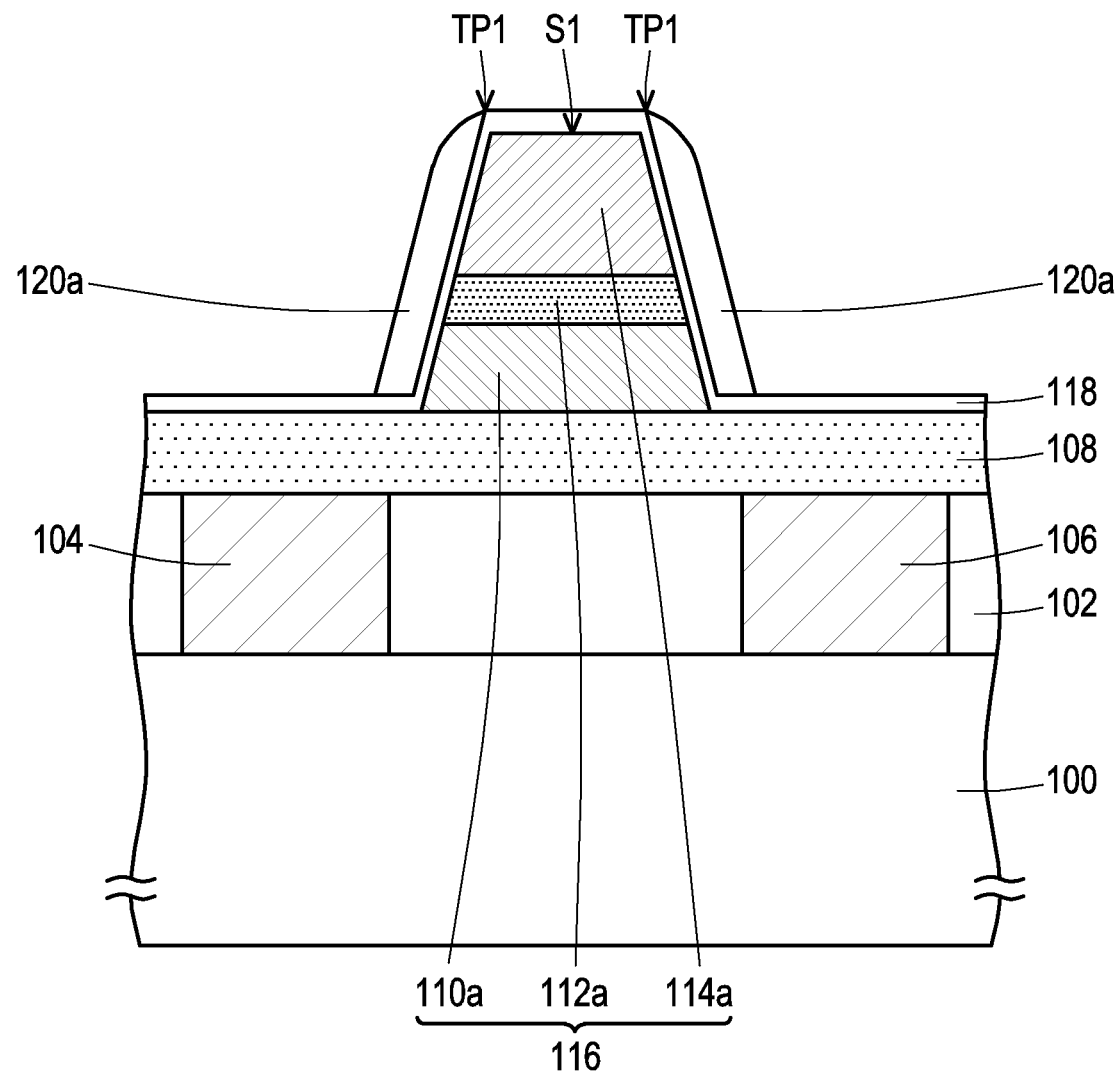

Referring to FIG. 1D, a dry etching process may be performed on the protection material layer 120 to form a protection layer 120a. When the dry etching process is performed on the protection material layer 120, the protection material layer 118 can be used to protect the SOT layer 108. That is, the protection material layer 118 can prevent the SOT layer 108 from being damaged by the dry etching process. In some embodiments, the protection layer 120a may have a protrusion portion TP1. The top of the protrusion portion TP1 may be higher than the top surface S1 of the MTJ stack 116. The material of the protection layer 120a is, for example, silicon nitride.

Figure 1E:
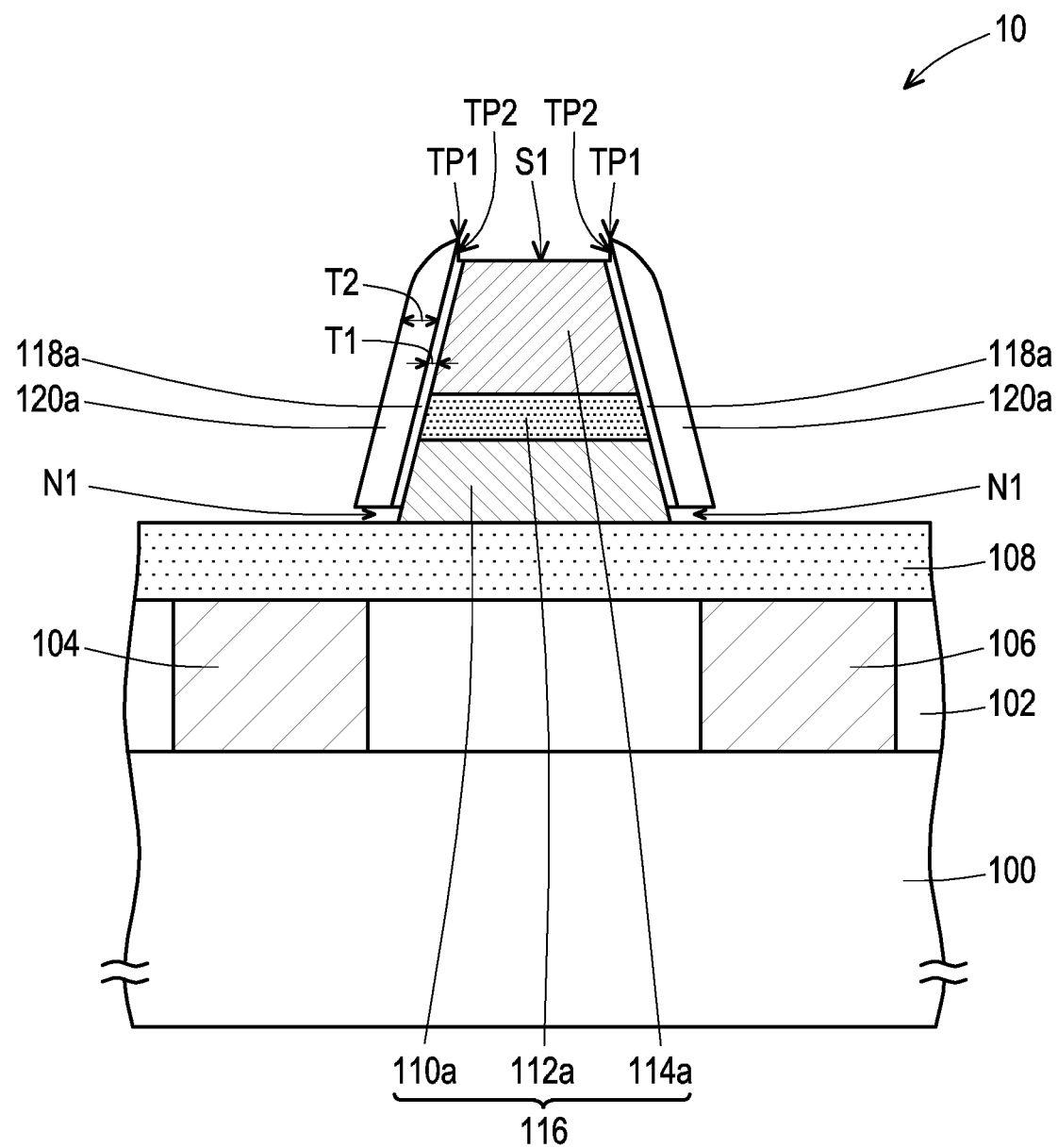

Referring to FIG. 1E, a wet etching process may be performed on the protection material layer 118 to form a protection layer 118a and a notch N1 and to expose a portion of the SOT layer 108 and the top surface S1 of the MTJ stack 116. By the above method, the protection layer 118a and the protection layer 120a may be formed on the sidewall of the MTJ stack 116. The protection layer 118a is located between the protection layer 120a and the MTJ stack 116. There is a notch N1 between the protection layer 120a and the SOT layer 108. In some embodiments, the protection layer 118a may have a protrusion portion TP2. The top of the protrusion portion TP2 may be higher than the top surface S1 of the MTJ stack 116. The material of the protection layer 118a is, for example, silicon oxide. In some embodiments, the thickness T1 of the protection layer 118a may be less than the thickness T2 of the protection layer 120a. In some embodiments, the thickness of the protection layer 118a is, for example, 100 angstroms (Å) to 150 Å. In some embodiments, the thickness of the protection layer 120a is, for example, 300 Å to 500 Å.

In some embodiments, as shown in FIG. 1E, the removal amount of the protection material layer 118 may be controlled by the above wet etching process, so that the notch N1 may be further located between the protection layer 118a and the SOT layer 108, but the invention is not limited thereto. In other embodiments, as shown in FIG. 2, the removal amount of the protection material layer 118 may be controlled by the above wet etching process, so that the notch N1 is not located between the protection layer 118a and the SOT layer 108. In other embodiments, as shown in FIG. 2, a portion of the protection layer 118a may be located between the protection layer 120a and the SOT layer 108. In some embodiments, as shown in FIG. 1E, the cross-sectional shape of the protection layer 118a may be a linear shape. In other embodiments, as shown in FIG. 2, the cross-sectional shape of the protection layer 118a may be an L-shape.

Hereinafter, the magnetic memory 10 of the above embodiment is described with reference to FIG. 1E. In addition, although the method for forming the magnetic memory 10 is described by taking the above method as an example, the invention is not limited thereto.

Referring to FIG. 1E, the magnetic memory 10 includes a substrate 100, a SOT layer 108, an MTJ stack 116, a protection layer 118a, and a protection layer 120a. In some embodiments, the magnetic memory 10 may be a magnetic random access memory (MRAM) such as a spin-orbit torque magnetic random access memory (SOT-MRAM). The SOT layer 108 is located over the substrate 100. The MTJ stack 116 is located on the SOT layer 108. The protection layer 118a and the protection layer 120a are located on the sidewall of the MTJ stack 116. The protection layer 118a is located between the protection layer 120a and the MTJ stack 116. There is a notch N1 between the protection layer 120a and the SOT layer 108.

The magnetic memory 10 may further include an interconnect structure 104 and an interconnect structure 106. The interconnect structure 104 is electrically connected to the SOT layer 108. The interconnect structure 106 is electrically connected to the SOT layer 108. The interconnect structure 104 and the interconnect structure 106 may be separated from each other. In some embodiments, the interconnect structure 104 may be located below the SOT layer 108 and may be located on one side of the MTJ stack 116, and the interconnect structure 106 may be located below the SOT layer 108 and may be located on another side of the MTJ stack 116.

Furthermore, the remaining components in the magnetic memory 10 may refer to the description of the above embodiments. Moreover, the details (e.g., the material, the arrangement, and the forming method) of each component in the magnetic memory 10 have been described in detail in the above embodiments, and the description thereof is not repeated here.

Based on the above embodiments, in the magnetic memory 10 and the manufacturing method thereof, the protection layer 118a and the protection layer 120a are located on the sidewall of the MTJ stack 116, the protection layer 118a is located between the protection layer 120a and the MTJ stack 116, and there is a notch N1 between the protection layer 120a and the SOT layer 108. Therefore, in the dry etching process for forming the protection layer 120a, the SOT layer 108 can be prevented from being damaged.

FIG. 3A to FIG. 3E are cross-sectional views illustrating a manufacturing process of a magnetic memory according to other embodiments of the invention. FIG. 4 is a cross-sectional view illustrating a magnetic memory according to other embodiments of the invention.

Figure 3A:
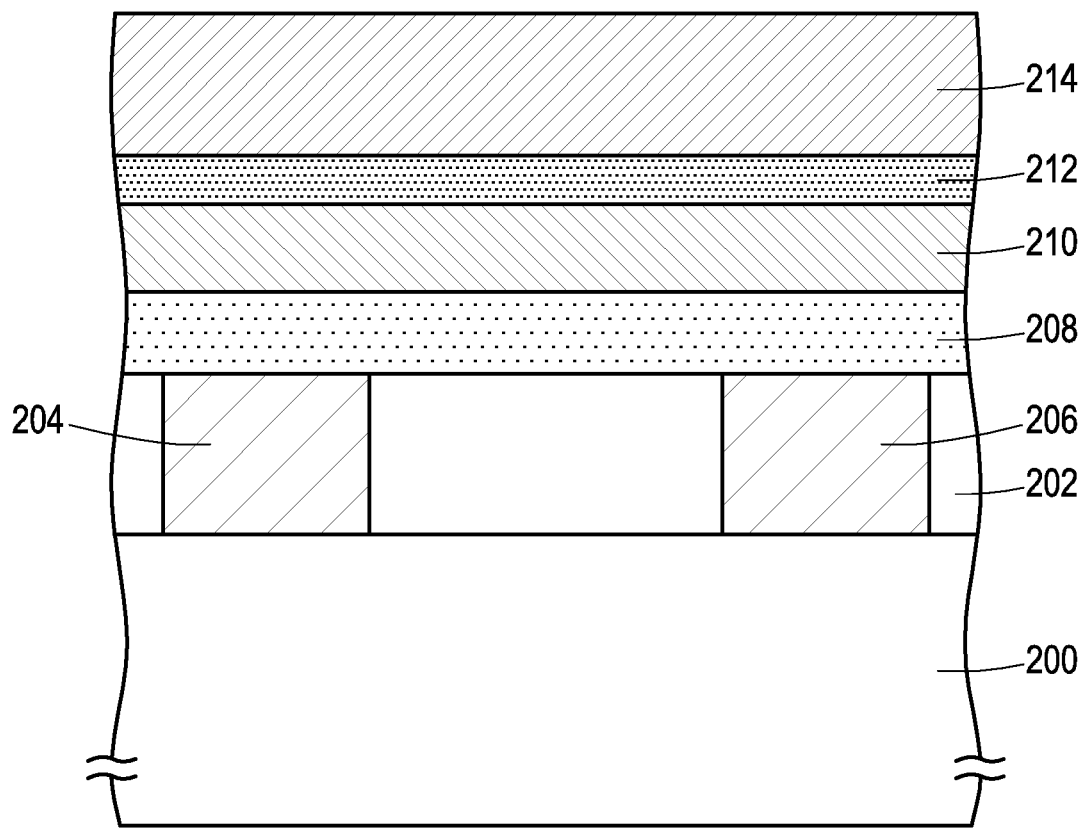
FIG. 3A to FIG. 3E are cross-sectional views illustrating a manufacturing process of a magnetic memory according to other embodiments of the invention.
Figure 4:
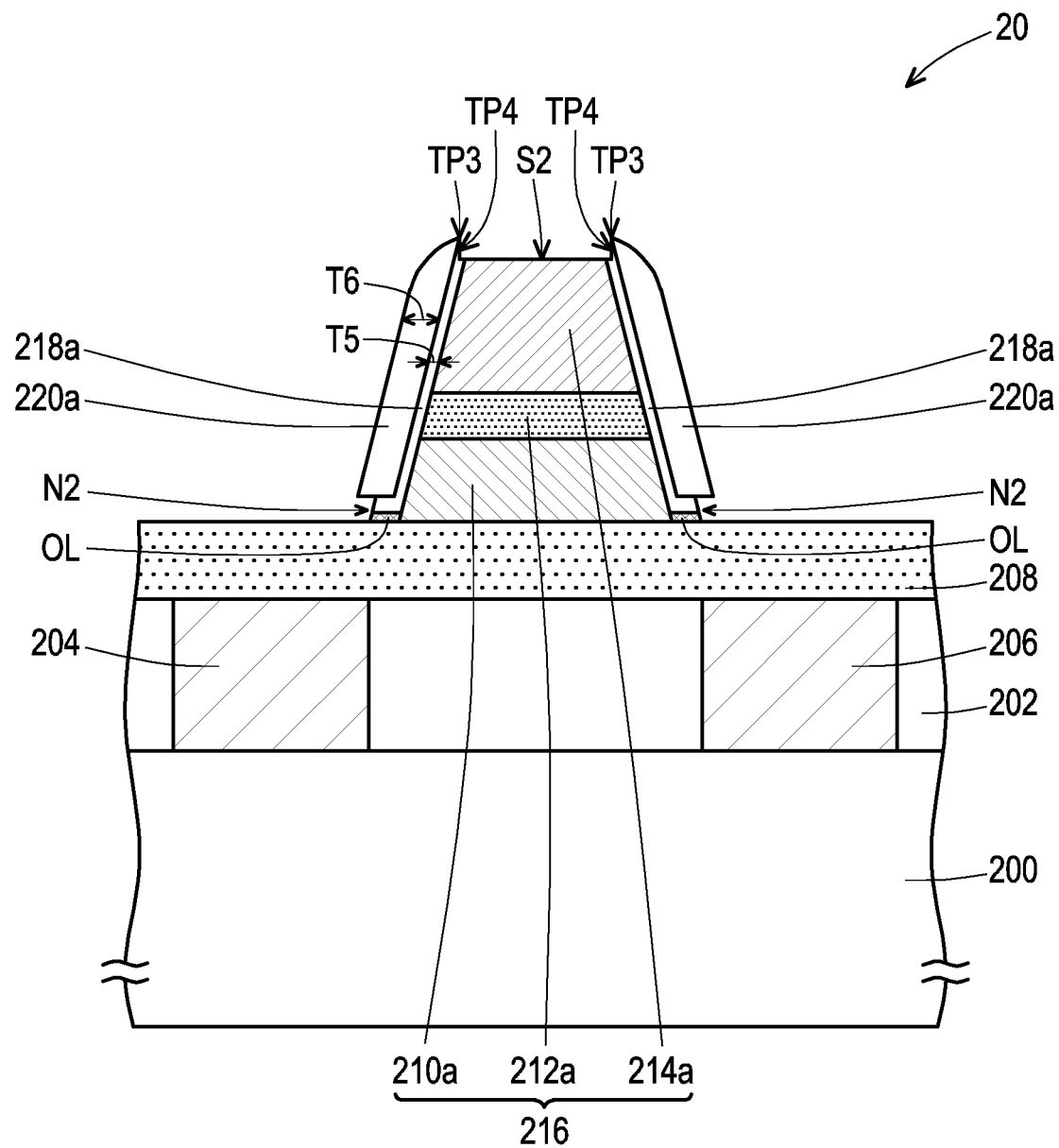
FIG. 4 is a cross-sectional view illustrating a magnetic memory according to other embodiments of the invention.

Referring to FIG. 3A, a substrate 200 is provided. The substrate 200 may be a semiconductor substrate such as a silicon substrate. In addition, although not shown in the figures, the substrate 200 may have required components thereon, such as semiconductor devices (e.g., active devices and/or passive devices), dielectric layers and/or interconnect structures, and the description thereof is omitted here.

A dielectric layer 202 may be formed on the substrate 200. The dielectric layer 202 may be a single-layer structure or a multilayer structure. The material of the dielectric layer 202 is, for example, silicon oxide, silicon nitride, or a combination thereof. The method of forming the dielectric layer 202 is, for example, a CVD method.

Furthermore, an interconnect structure 204 and an interconnect structure 206 may be formed. The interconnect structure 204 and the interconnect structure 206 may be separated from each other. The interconnect structure 204 and the interconnect structure 206 may be formed in the dielectric layer 202. In some embodiments, the interconnect structure 204 and the interconnect structure 206 may be vias, but the invention is not limited thereto. In some embodiments, the interconnect structure 204 and the interconnect structure 206 may be electrically connected to other interconnect structures (not shown) on substrate 200. The materials of the interconnect structure 204 and the interconnect structure 206 are, for example, metal such as tungsten. In some embodiments, the interconnect structure 204 and the interconnect structure 206 may be formed by a damascene process.

A SOT layer 208 is formed over the substrate 200. The interconnect structure 204 and the interconnect structure 206 may be electrically connected to the SOT layer 208. In some embodiments, the interconnect structure 204 and the interconnect structure 206 may be in direct contact with the SOT layer 208. The material of the SOT layer 208 is, for example, tantalum, tantalum nitride, platinum, tungsten, or tungsten nitride. In some embodiments, the SOT layer 208 may be formed by a deposition process (e.g., a PVD process), a lithography process, and an etching process.

A free material layer 210, a tunnel barrier material layer 212, and a pinned material layer 214 may be sequentially formed on the SOT layer 208. The material of the free material layer 210 is, for example, iron, cobalt, or nickel. The method of forming the free material layer 210 is, for example, a PVD method. The material of the tunnel barrier material layer 212 is, for example, magnesium oxide. The method of forming the tunnel barrier material layer 212 is, for example, a PVD method. The material of the pinned material layer 214 is, for example, iron, cobalt, or nickel. The method of forming the pinned material layer 214 is, for example, a PVD method.

Figure 3B:
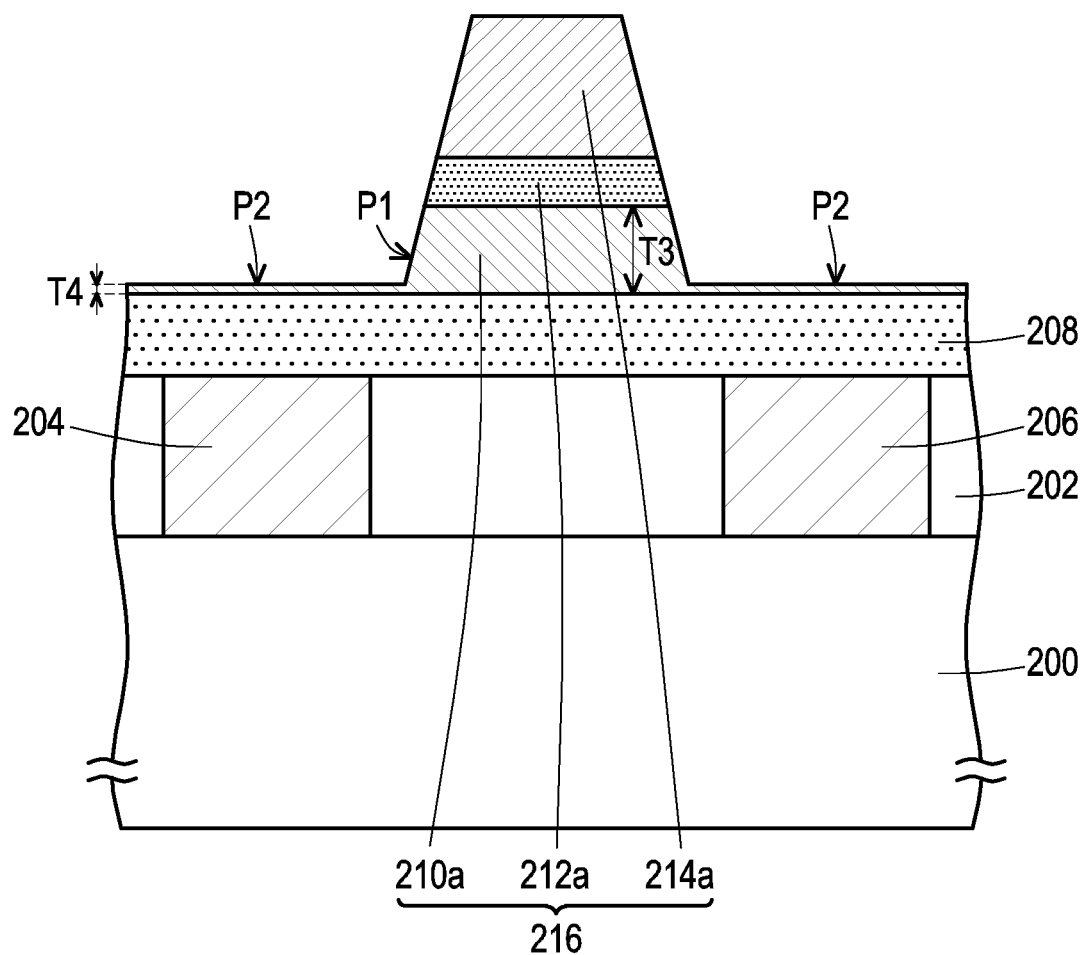

Referring to FIG. 3B, the pinned material layer 214, the tunnel barrier material layer 212, and the free material layer 210 may be patterned to form a pinned layer 214a, a tunnel barrier layer 212a, and a free layer 210a. Therefore, a MTJ stack 216 may be formed on the SOT layer 208. The MTJ stack 216 may include the free layer 210a, the pinned layer 214a, and the tunnel barrier layer 212a. The free layer 210a is located on the SOT layer 208. The material of the free layer 210a is, for example, iron, cobalt, or nickel. The pinned layer 214a is located on the free layer 210a. The material of the pinned layer 214a is, for example, iron, cobalt, or nickel. The tunnel barrier layer 212a is located between the pinned layer 214a and the free layer 210a. The material of the tunnel barrier layer 212a is, for example, magnesium oxide. In some embodiments, the pinned material layer 214, the tunnel barrier material layer 212, and the free material layer 210 may be patterned by a lithography process and an etching process (e.g., a dry etching process).

In addition, the free layer 210a may include a main portion P1 and a side portion P2. The main portion P1 is located below the tunnel barrier layer 212a. The side portion P2 is located aside the main portion P1 and is connected to the main portion P1. The thickness T3 of the main portion P1 may be greater than the thickness T4 of the side portion P2. Furthermore, in the process of performing the etching process (e.g., dry etching process) on the free material layer 210, the SOT layer 208 is covered by the main portion P1 and the side portion P2 of the free layer 210a, so the SOT layer 208 can be prevented from being damaged.

Figure 3C:
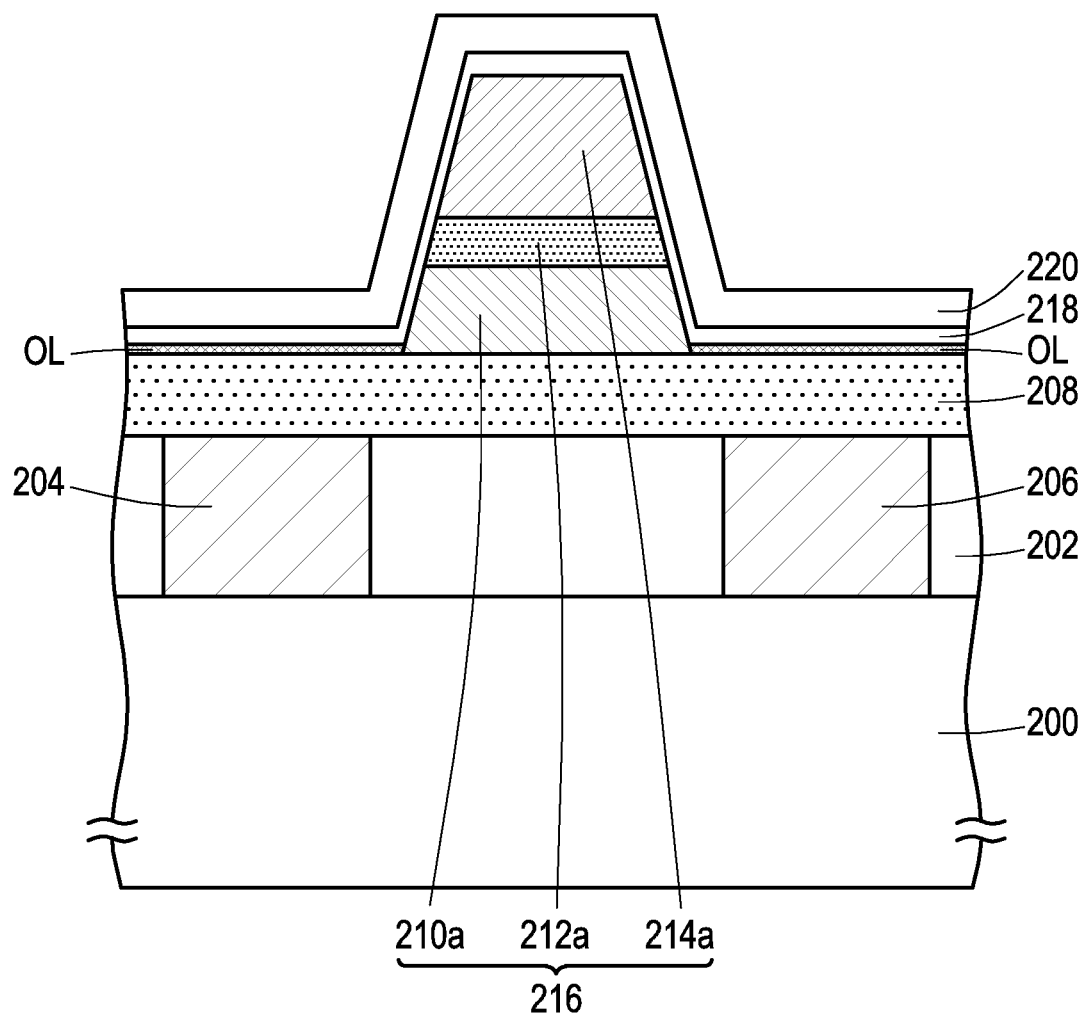

Referring to FIG. 3C, a protection material layer 218 may be conformally formed on the pinned layer 214a, the tunnel barrier layer 212a, the free layer 210a, and the SOT layer 208. The material of the protection material layer 218 is, for example, silicon oxide. The method of forming the protection material layer 218 is, for example, an ALD method. In the step of forming the protection material layer 218, the side portion P2 may be oxidized to an oxide layer OL. In some embodiments, the material of the oxide layer OL is, for example, a metal oxide.

A protection material layer 220 may be conformally formed on the protection material layer 218. The material of the protection material layer 220 is, for example, silicon nitride. The method of forming the protection material layer 220 is, for example, an ALD method.

Figure 3D:
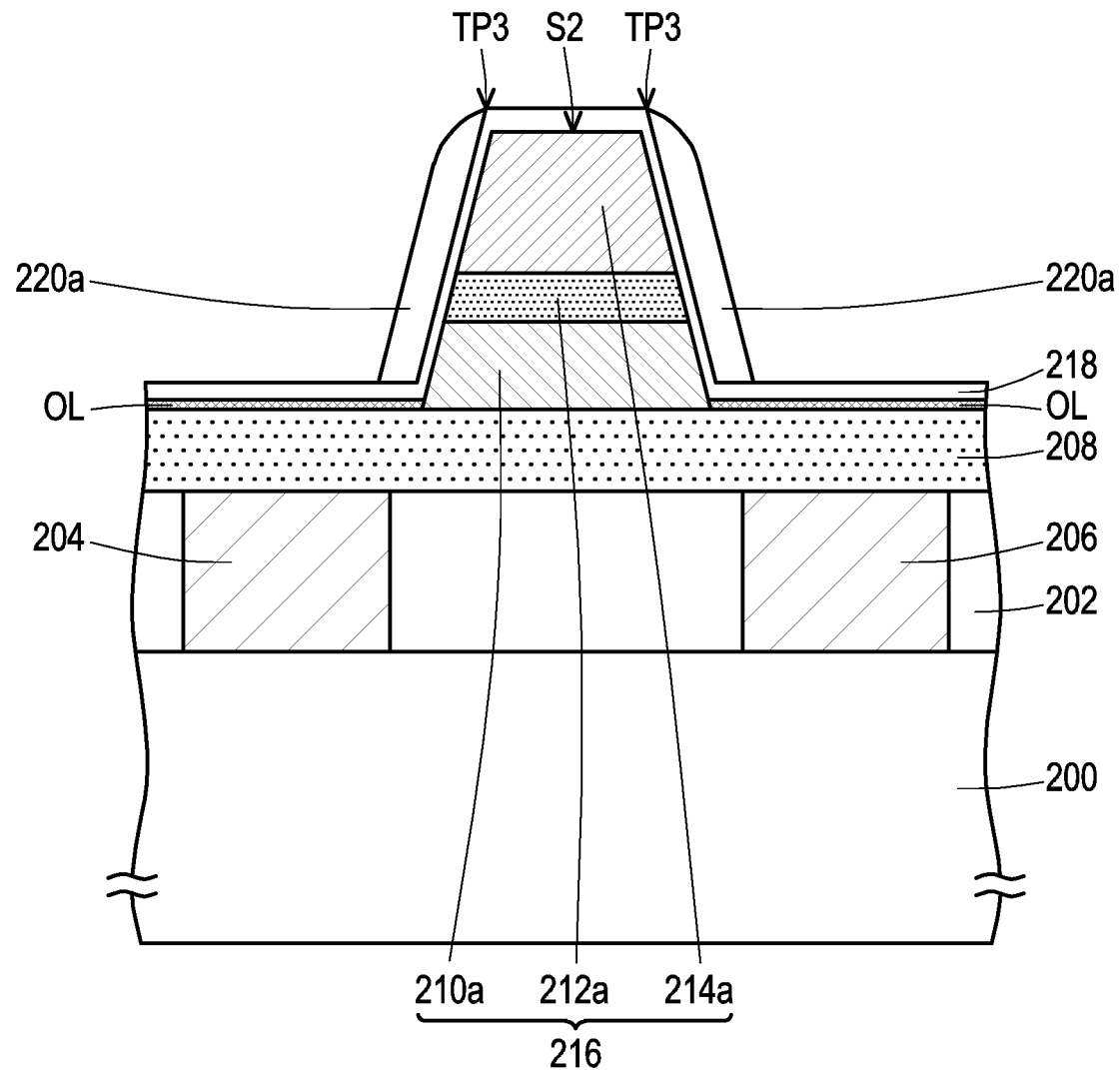

Referring to FIG. 3D, a dry etching process may be performed on the protection material layer 220 to form a protection layer 220a. When the dry etching process is performed on the protection material layer 220, the protection material layer 218 can be used to protect the SOT layer 208. That is, the protection material layer 218 can prevent the SOT layer 208 from being damaged by the dry etching process. In some embodiments, the protection layer 220a may have a protrusion portion TP3. The top of the protrusion portion TP3 may be higher than the top surface S2 of the MTJ stack 216. The material of the protection layer 220a is, for example, silicon nitride.

Figure 3E:
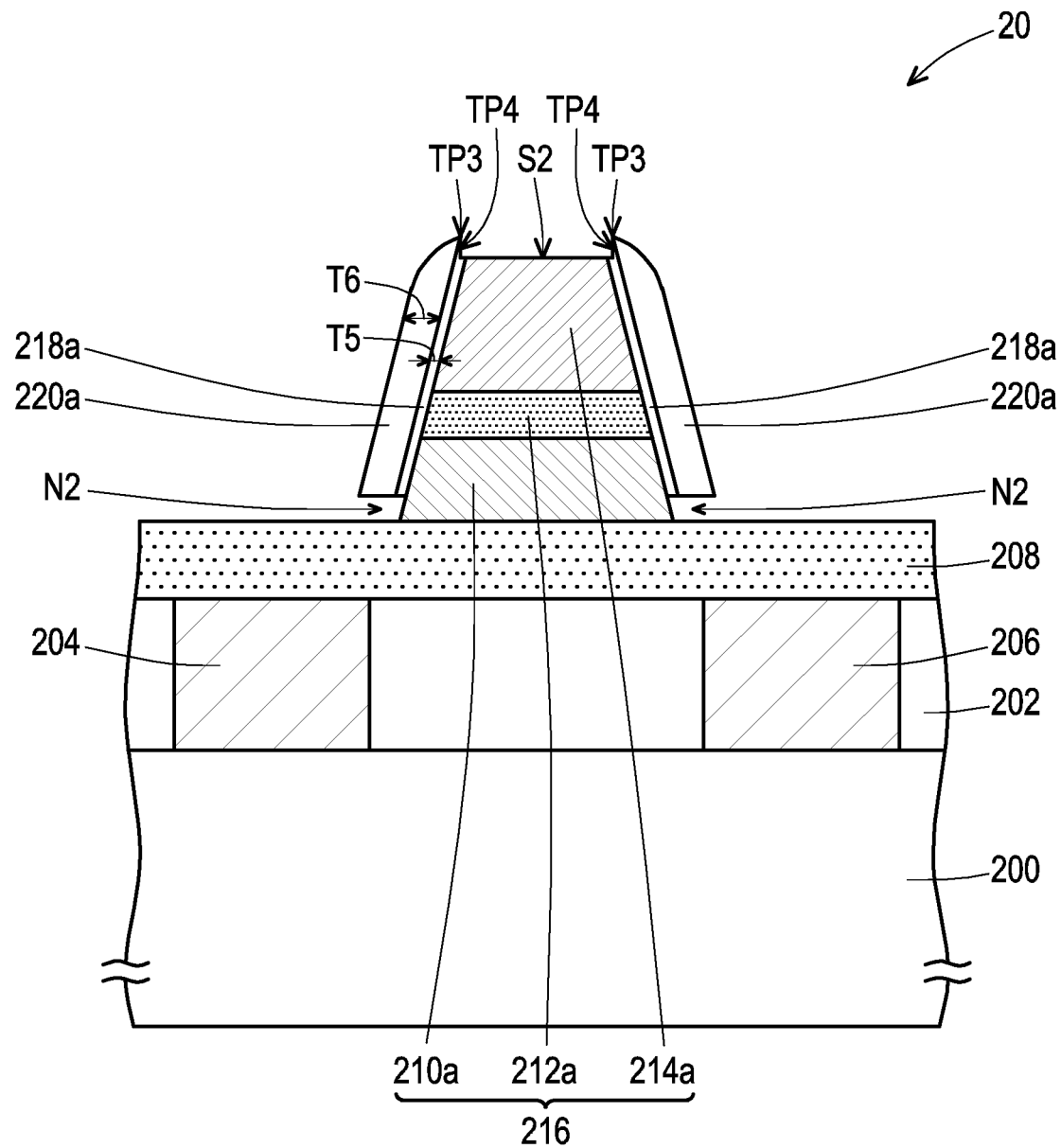

Referring to FIG. 3E, a wet etching process may be performed on the protection material layer 218 and the oxide layer OL to form a protection layer 218a and a notch N2 and to expose a portion of the SOT layer 208 and the top surface S2 of the pinned layer 214a. By the above method, the protection layer 218a and the protection layer 220a may be formed on the sidewall of the MTJ stack 216. The protection layer 218a is located between the protection layer 220a and the MTJ stack 216. There is a notch N2 between the protection layer 220a and the SOT layer 208. In some embodiments, the protection layer 218a may have a protrusion portion TP4. The top of the protrusion portion TP4 may be higher than the top surface S2 of the MTJ stack 216. The material of the protection layer 218a is, for example, silicon oxide. In some embodiments, the thickness T5 of the protection layer 218a may be less than the thickness T6 of the protection layer 220a. In some embodiments, the thickness of the protection layer 218a is, for example, 100 Å to 150 Å. In some embodiments, the thickness of the protection layer 220a is, for example, 300 Å to 500 Å.

In some embodiments, as shown in FIG. 3E, the removal amount of the protection material layer 218 may be controlled by the above wet etching process, so that the notch N2 may be further located between the protection layer 218a and the SOT layer 208, but the invention is not limited thereto. In other embodiments, as shown in FIG. 4, the removal amount of the protection material layer 218 may be controlled by the above wet etching process, so that the notch N2 is not located between the protection layer 218a and the SOT layer 208. In other embodiments, as shown in FIG. 4, a portion of the protection layer 218a may be located between the protection layer 220a and the SOT layer 208. In some embodiments, as shown in FIG. 3E, the cross-sectional shape of the protection layer 218a may be a linear shape. In other embodiments, as shown in FIG. 4, the cross-sectional shape of the protection layer 218a may be an L-shape.

In some embodiments, as shown in FIG. 3E, the oxide layer OL may be completely removed in the above wet etching process, but the invention is not limited thereto. In other embodiments, as shown in FIG. 4, a portion of the oxide layer OL may be removed in the above wet etching process, and the remaining oxide layer OL may be located between the protection layer 218 a and the SOT layer 208.

Hereinafter, the magnetic memory 20 of the above embodiment is described with reference to FIG. 3E. In addition, although the method for forming the magnetic memory 20 is described by taking the above method as an example, the invention is not limited thereto.

Referring to FIG. 3E, the magnetic memory 20 includes a substrate 200, a SOT layer 208, an MTJ stack 216, a protection layer 218a, and a protection layer 220a. In some embodiments, the magnetic memory 20 may be a magnetic random access memory (MRAM) such as a spin-orbit torque magnetic random access memory (SOT-MRAM). The SOT layer 208 is located over the substrate 200. The MTJ stack 216 is located on the SOT layer 208. The protection layer 218a and the protection layer 220a are located on the sidewall of the MTJ stack 216. The protection layer 218a is located between the protection layer 220a and the MTJ stack 216. There is a notch N2 between the protection layer 220a and the SOT layer 208.

The magnetic memory 20 may further include an interconnect structure 204 and an interconnect structure 206. The interconnect structure 204 is electrically connected to the SOT layer 208. The interconnect structure 206 is electrically connected to the SOT layer 208. The interconnect structure 204 and the interconnect structure 206 may be separated from each other. In some embodiments, the interconnect structure 204 may be located below the SOT layer 208 and may be located on one side of the MTJ stack 216, and the interconnect structure 206 may be located below the SOT layer 208 and may be located on another side of the MTJ stack 216.

In other embodiments, the magnetic memory 20 may further include an oxide layer OL (FIG. 4). The oxide layer OL is located between the protection layer 218a and the SOT layer 208.

Furthermore, the remaining components in the magnetic memory 20 may refer to the description of the above embodiments. Moreover, the details (e.g., the material, the arrangement, and the forming method) of each component in the magnetic memory 20 have been described in detail in the above embodiments, and the description thereof is not repeated here.

Based on the above embodiments, in the magnetic memory 20 and the manufacturing method thereof, the protection layer 218a and the protection layer 220a are located on the sidewall of the MTJ stack 216, the protection layer 218a is located between the protection layer 220a and the MTJ stack 216, and there is a notch N2 between the protection layer 220a and the SOT layer 208. Therefore, in the dry etching process for forming the protection layer 220a, the SOT layer 208 can be prevented from being damaged.

In summary, in the magnetic memory and the manufacturing method thereof of the aforementioned embodiments, the first protection layer and the second protection layer are located on the sidewall of the MTJ stack, the first protection layer is located between the second protection layer and the MTJ stack, and there is a notch between the second protection layer and the SOT layer. Therefore, in the dry etching process for forming the second protection layer, the SOT layer can be prevented from being damaged.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A magnetic memory, comprising:
   a substrate;
   a spin-orbit torque (SOT) layer located over the substrate;
   a magnetic tunnel junction (MTJ) stack located on the SOT layer; and
   a first protection layer and a second protection layer located on a sidewall of the MTJ stack, wherein
   the first protection layer is located between the second protection layer and the MTJ stack,
   there is a notch between the second protection layer and the SOT layer, and
   a top of the notch is higher than a bottom of the MTJ stack.

2. The magnetic memory according to claim 1, wherein the notch is further located between the first protection layer and the SOT layer.

3. The magnetic memory according to claim 1, wherein a cross-sectional shape of the first protection layer comprises a linear shape.

4. The magnetic memory according to claim 1, wherein a cross-sectional shape of the first protection layer comprises an L-shape.

5. The magnetic memory according to claim 1, further comprising:
   an oxide layer located between the first protection layer and the SOT layer.

6. The magnetic memory according to claim 1, wherein the first protection layer has a protrusion portion, and a top of the protrusion portion is higher than a top surface of the MTJ stack.

7. The magnetic memory according to claim 1, wherein the second protection layer has a protrusion portion, and a top of the protrusion portion is higher than a top surface of the MTJ stack.

8. The magnetic memory according to claim 1, wherein the MTJ stack comprises:
   a free layer located on the SOT layer;
   a pinned layer located on the free layer; and
   a tunnel barrier layer located between the pinned layer and the free layer.

9. The magnetic memory according to claim 1, further comprising:
   a first interconnect structure electrically connected to the SOT layer; and a second interconnect structure electrically connected to the SOT layer.

10. The magnetic memory according to claim 9, wherein the first interconnect structure is located below the SOT layer and is located on one side of the MTJ stack, and the second interconnect structure is located below the SOT layer and is located on another side of the MTJ stack.

11. A manufacturing method of a magnetic memory, comprising:
providing a substrate;
forming a SOT layer over the substrate;
forming an MTJ stack on the SOT layer; and
forming a first protection layer and a second protection layer on a sidewall of the MTJ stack, wherein
the first protection layer is located between the second protection layer and the MTJ stack,
there is a notch between the second protection layer and the SOT layer, and
a top of the notch is higher than a bottom of the MTJ stack.

12. The manufacturing method of the magnetic memory according to claim 11, wherein a method of forming the first protection layer and the second protection layer comprises:
conformally forming a first protection material layer on the MTJ stack and the SOT layer;
conformally forming a second protection material layer on the first protection material layer;
performing a dry etching process on the second protection material layer to form the second protection layer; and
performing a wet etching process on the first protection material layer to form the first protection layer and the notch and to expose a portion of the SOT layer and a top surface of the MTJ stack.

13. The manufacturing method of the magnetic memory according to claim 11, wherein the MTJ stack comprises:
a free layer located on the SOT layer;
a pinned layer located on the free layer; and
a tunnel barrier layer located between the pinned layer and the free layer.

14. The manufacturing method of the magnetic memory according to claim 13, wherein a method of forming the MTJ stack comprises:
sequentially forming a free material layer, a tunnel barrier material layer, and a pinned material layer on the SOT layer; and
patterning the pinned material layer, the tunnel barrier material layer, and the free material layer to form the pinned layer, the tunnel barrier layer, and the free layer and to expose a portion of the SOT layer.

15. The manufacturing method of the magnetic memory according to claim 13, wherein a method of forming the MTJ stack, the first protection layer, and the second protection layer comprises:
sequentially forming a free material layer, a tunnel barrier material layer, and a pinned material layer on the SOT layer;
patterning the pinned material layer, the tunnel barrier material layer, and the free material layer to form the pinned layer, the tunnel barrier layer, and the free layer, wherein
the free layer comprises:
a main portion located below the tunnel barrier layer; and
a side portion located aside the main portion and connected to the main portion, wherein a thickness of the main portion is greater than a thickness of the side portion;
conformally forming a first protection material layer on the pinned layer, the tunnel barrier layer, the free layer, and the SOT layer, wherein in the step of forming the first protection material layer, the side portion is oxidized to an oxide layer;
conformally forming a second protection material layer on the first protection material layer;
performing a dry etching process on the second protection material layer to form the second protection layer; and
performing a wet etching process on the first protection material layer and the oxide layer to form the first protection layer and the notch and to expose a portion of the SOT layer and a top surface of the pinned layer.

16. The manufacturing method of the magnetic memory according to claim 15, wherein the oxide layer is completely removed in the wet etching process.

17. The manufacturing method of the magnetic memory according to claim 15, wherein a portion of the oxide layer is removed in the wet etching process, and the remaining oxide layer is located between the first protection layer and the SOT layer.

18. The manufacturing method of the magnetic memory according to claim 11, further comprising:
forming a first interconnect structure and a second interconnect structure, wherein the first interconnect structure and the second interconnect structure are electrically connected to the SOT layer.

19. The manufacturing method of the magnetic memory according to claim 11, wherein the notch is further located between the first protection layer and the SOT layer.

20. The manufacturing method of the magnetic memory according to claim 11, wherein the second protection layer has a protrusion portion, and a top of the protrusion portion is higher than a top surface of the MTJ stack.

* * * * *